US009118392B2

(12) United States Patent
Sundar et al.

(10) Patent No.: US 9,118,392 B2
(45) Date of Patent: Aug. 25, 2015

(54) ISOLATED SERIALIZER-DESERIALIZER

(71) Applicant: Silicon Laboratories Inc., Austin, TX (US)

(72) Inventors: Siddharth Sundar, Austin, TX (US); Michael J. Mills, Austin, TX (US); Hua Zhu, Austin, TX (US); Riad Wahby, Austin, TX (US); Jeffrey L. Sonntag, Austin, TX (US); Yunteng Huang, Palo Alto, CA (US); Anantha Nag Nemmani, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/041,459

(22) Filed: Sep. 30, 2013

(65) Prior Publication Data
US 2014/0307759 A1    Oct. 16, 2014

Related U.S. Application Data

(60) Provisional application No. 61/812,528, filed on Apr. 16, 2013.

(51) Int. Cl.
*H04B 1/38* (2006.01)
*H04B 1/40* (2015.01)
*H04B 3/32* (2006.01)

(52) U.S. Cl.
CPC ... *H04B 1/40* (2013.01); *H04B 3/32* (2013.01)

(58) Field of Classification Search
USPC ............ 375/260, 259, 219; 455/93, 446, 449, 455/725
See application file for complete search history.

(56) References Cited

U.S. PATENT DOCUMENTS

| 7,075,329 | B2 | 7/2006 | Chen et al. |
| 8,169,108 | B2 | 5/2012 | Dupuis et al. |
| 8,198,951 | B2 | 6/2012 | Dong et al. |
| 8,477,856 | B2* | 7/2013 | Gaalaas ......................... 375/258 |
| 2008/0046627 | A1* | 2/2008 | Castro et al. .................. 710/313 |

* cited by examiner

*Primary Examiner* — Rahel Guarino
(74) *Attorney, Agent, or Firm* — Abel Law Group, LLP

(57) ABSTRACT

A first integrated circuit die receives input data from a plurality of input channels and combines the input data from the plurality of input channels into combined data. The first integrated circuit die transmits the combined data across an isolation communication channel. A second integrated circuit die that is coupled to the isolation communication channel decodes the transmitted combined data and supplies the decoded transmitted combined data to respective output channels corresponding to the input channels.

25 Claims, 6 Drawing Sheets

ISOLATED SERIALIZER-DESERIALIZER

CROSS REFERENCE TO RELATED APPLICATIONS

This application claims benefit under 35 U.S.C. §119 of provisional application No. 61/812,528, entitled "Isolated Serializer-Deserializer," filed Apr. 16, 2013, which application is hereby incorporated by reference.

BACKGROUND

1. Field of the Invention

This invention relates to communications over a communications channel.

2. Description of the Related Art

Isolation communication channels are utilized in various applications where necessary to prevent current flow between separate electric circuits while still maintaining communication between the circuits. The isolation may be required for signal isolation, safety, or for other reasons. For example, within power conversion products, digital links that provide isolation may be used to provide control and/or feedback information between high and low voltage circuits in the power conversion products. Communication between isolated circuits has typically involved a transmitter and receiver communicating over a single isolation channel. The isolation channels may be implemented, e.g., using capacitive or inductive isolation techniques.

SUMMARY OF EMBODIMENTS OF THE INVENTION

In order to improve communication capabilities over isolation communication channels, embodiments combine data from multiple input channels and communicate combined data over fewer isolation channels than input channels to multiple output channels.

In an embodiment, a method is provided that includes receiving input data from a plurality of input channels at a first integrated circuit die and combining the input data from the plurality of input channels into combined data. The first integrated circuit die transmits the combined data serially from the plurality of channels across an isolation communication channel. A second integrated circuit die that is coupled to the isolation communication channel decodes the transmitted combined data and supplies the decoded transmitted combined data to respective output channels corresponding to the input channels.

In another embodiment, an apparatus includes a first integrated circuit die that includes an interface to receive information from a plurality of channels, an encoder circuit to combine information from the plurality of input channels into a combined channel data. An isolation communication channel receives the combined channel data. A second integrated circuit die is coupled to the isolation communication channel and includes a decoder circuit to decode the combined channel data transmitted over the isolation channel and an output circuit to supply the decoded combined channel data to respective output channels corresponding to the plurality of input channels.

In another embodiment, a packaged integrated circuit includes an output integrated circuit die that includes a receiver circuit coupled to an isolation communication channel. The output circuit die further includes a decoder and control logic coupled to the receiver circuit to decode combined channel data received from the isolation communication channel and to supply data to a plurality of output channels. The decoder and control logic also detects error conditions associated with the combined channel data. The decoder and control logic is configured to cause respective default data to be supplied to the respective output channels responsive to detecting the error condition and to supply decoded combined channel data to respective output channels responsive to satisfactory decode of the combined channel data.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
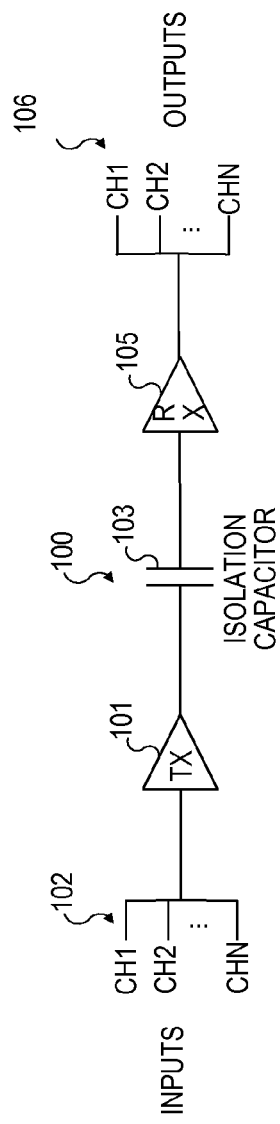
FIG. 1 illustrates an exemplary system with an isolation channel.

Various embodiments described herein provide improved approaches for implementing serialize-deserialize functionality for multiple channels in an isolated system. FIG. 1 illustrates an exemplary isolated system 100 including an isolation channel. The isolation system 100 includes a transmitter (TX) 101, an isolation capacitor 103, which may be implemented as a pair of differential isolation capacitors, and a receiver block 105 that can recreate the input to the TX, with some jitter and pulse width distortion (PWD). The system may be incorporated in various applications where isolation is required between separate electric circuits while still maintaining communication between the circuits. The isolation channel may be used to provide feedback information from one side of the isolation channel to the other, to provide control information, or to otherwise communicate necessary information between sides of a system that are isolated from each other.

While capacitive isolation is shown in the example system of FIG. 1, embodiments described herein may utilize various approaches to isolation such as inductive coupling using transformers including magnetic pulse couplers and magnetic resistive couplers, capacitive couplers, or optical couplers. Various isolation approaches are described, e.g., in U.S. Pat.

No. 8,169,108 entitled "Capacitive Isolator" and U.S. Pat. No. 8,198,95 entitled "Capacitive Isolation Circuitry," which patents are incorporated herein by reference in their entirety. An isolation approach using a transformer is also described, e.g., in U.S. Pat. No. 7,075,329 where a transmitter circuit drives a primary winding with a first type of signal in response to a first edge of an input signal and drives the primary winding with a second type of signal in response to a second edge of the input signal. The secondary winding, which is isolated from the primary winding, is coupled to a receiver that recreates the input signal.

Referring again to FIG. 1, the transmitter 101 receives data from multiple input channels 102. The multiple channels are combined and sent across the isolation channel serially. On the receive side, once the data is decoded, it is supplied to the various output channels corresponding to the input channels. Note that while the examples herein show use of a single bit serial isolated link, various aspects of embodiments herein can be applied to systems with multiple serial isolation channels. For example, the data from several input channels may be combined and sent over one of the isolation channels and data from several other input channels may be combined and sent serially over another isolation channel. In still another embodiment, multiple channels may be combined in a frame and sent across a single isolation channel, while another isolation channel carries a clock associated with the frame.

Figure 2:
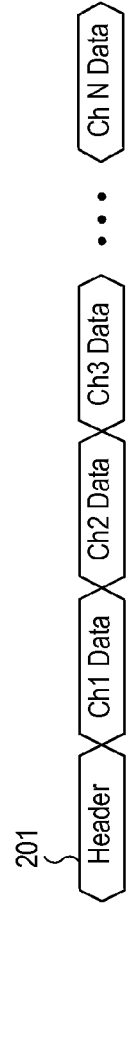
FIG. 2 illustrates a frame that may be used to transmit data on the isolation channel according to an embodiment.

The issue of how to serialize the data from multiple input channels into a "frame", or other appropriate combination of the input data bits, along with the associated clock recovery (or of some timing reference on the secondary side) can be independent of the approach chosen to implement the serializer-deserializer functionality. In order to transmit data from multiple channels across an isolation channel, the isolated system may transmit the data serially. The particular type of isolation utilized can be independent of the serializing approach. The "state" of the input bits at a given time can be represented as shown in FIG. 2. The header 201 delineates the start of the frame, while Ch1 Data describes the state of channel 1. The channel data encoding could be as simple as a single bit corresponding to whether the channel was high or low at the time of sampling the data. With some schemes (like edge position recovery as explained further herein), or depending on the type of encoding scheme used, the data could include multiple bits for each input channel. There are many encoding schemes available. Typically, encoding schemes trade off header length/startup time/phase-locked loop (PLL) complexity for efficiency (in terms of excess bandwidth spent on encoding above what is needed for data). By combining data from multiple input channels for transmission across a single isolation channel (or at least fewer isolation channels than input channels), significant resources can be saved by not having to allocate an isolation channel to each input channel.

One particular encoding scheme based on Manchester encoding has advantages including no startup time/synchronization needed, no need to have a PLL to decode the received signal, and next-frame recovery in case of an erroneous transmission. Note that a PLL can be used in embodiments if desired. Traditional Manchester encoding guarantees a transition in every bit by representing a "high" bit as 10, and a low "bit" as 01, thereby sacrificing half the bandwidth of the channel. One of the issues with Manchester encoding is the need to synchronize to an "intra-bit transition" before you can decode the stream of data correctly. In one embodiment, this need for an intra-bit transition is solved by adding a header to every frame which is formed by 3 bits (or more) with the same value followed by one bit with a different value, e.g., '0001'.

As the pattern '000' is a forbidden data pattern in Manchester encoding, the pattern '0001' provides the decoding circuit a signal to reset and get ready for the next frame of data. That way the receiver can always lock on correctly to data from the first frame itself when it detects the transition from 0 to 1 in the header.

Providing a transition from 0 to 1 in the frame header also has the additional advantage of providing a quick recovery in case of errors in the frame. For example, if some of the data in the frame gets corrupted during transmission, and the receiving side loses position in the frame, and the output is only erroneous for that particular frame. As soon as the header for the next frame is transmitted, the receiving side is automatically resynchronized to the right position, and the output is corrected in that frame.

Figure 3:
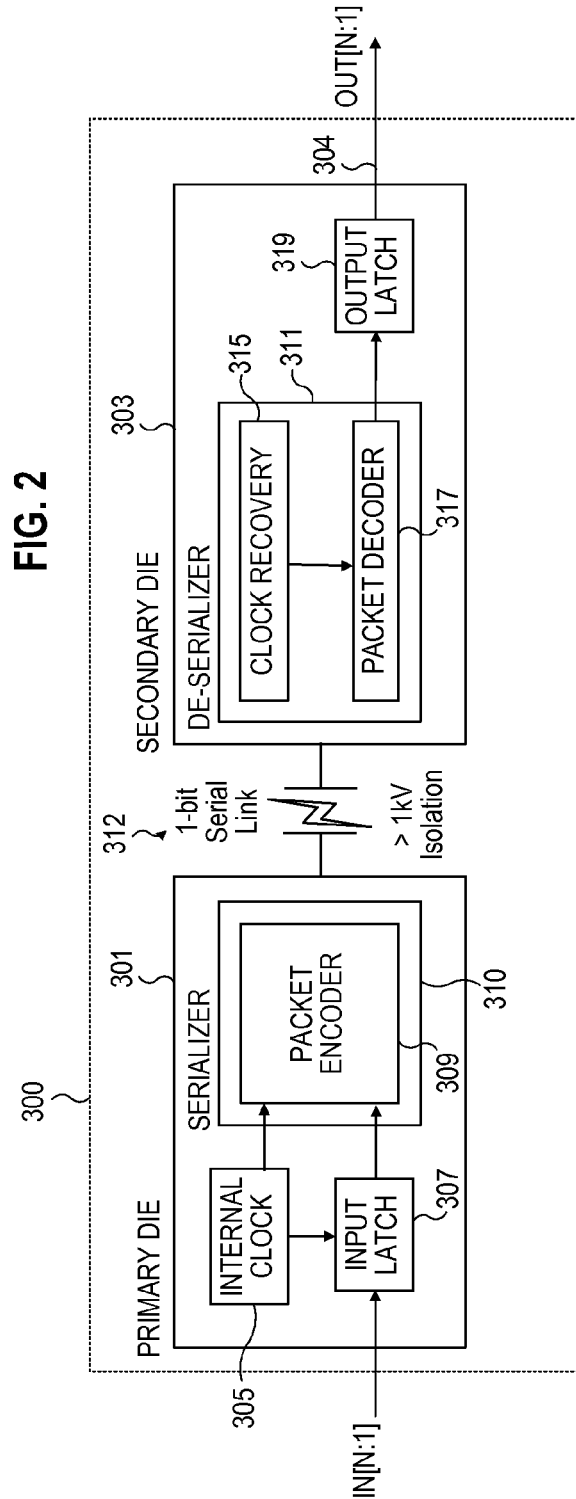
FIG. 3 illustrates a high level block diagram of an isolation system according to an embodiment.

FIG. 3 illustrates an embodiment with continuous packet transmission. In the embodiment of FIG. 3, the inputs IN[N: 1] are considered to be independent and asynchronous. The N inputs correspond, e.g., to the N input channels of FIG. 1. A packaged integrated circuit 300 includes a primary side 301, which is implemented as a separate integrated circuit die from the secondary side 303. The primary side 301 has an internal clock 305 that is used to latch the input data into input latches 307, as well as to construct an encoded packet in packet encoder 309, which is part of the overall serializer logic 310. The encoded packet may be encoded to be the packet shown in FIG. 2 with each channel being allocated a slot in the packet. The packet may be encoded using Manchester encoding and have a header transition. The encoded packet is then transmitted across the isolation channel 312. Note that the term packet and frame are used herein interchangeably.

The secondary side 303 decodes the received packet (dependent on the encoding scheme), and updates the outputs 304 as soon as the corresponding decoded data becomes available. In the embodiment of FIG. 3, the deserializer 311 includes clock recovery 315 based, e.g., on the transitions in the data, and a packet decoder 317 to decode the received data based on the encoding scheme. In an embodiment a phase-locked loop may be utilized as part of a clock and data recovery circuit to effectuate clock recovery. An output latch 319 latches the data supplied from the packet decoder 317 and supplies the decoded data to the outputs 304 (OUT[N:1]), where each of the output channels corresponds to one of the input channels. In this embodiment, each output channel gets updated once a frame. The frames are transmitted continuously, providing a maximum data rate that is limited by the frame size.

Figure 4:
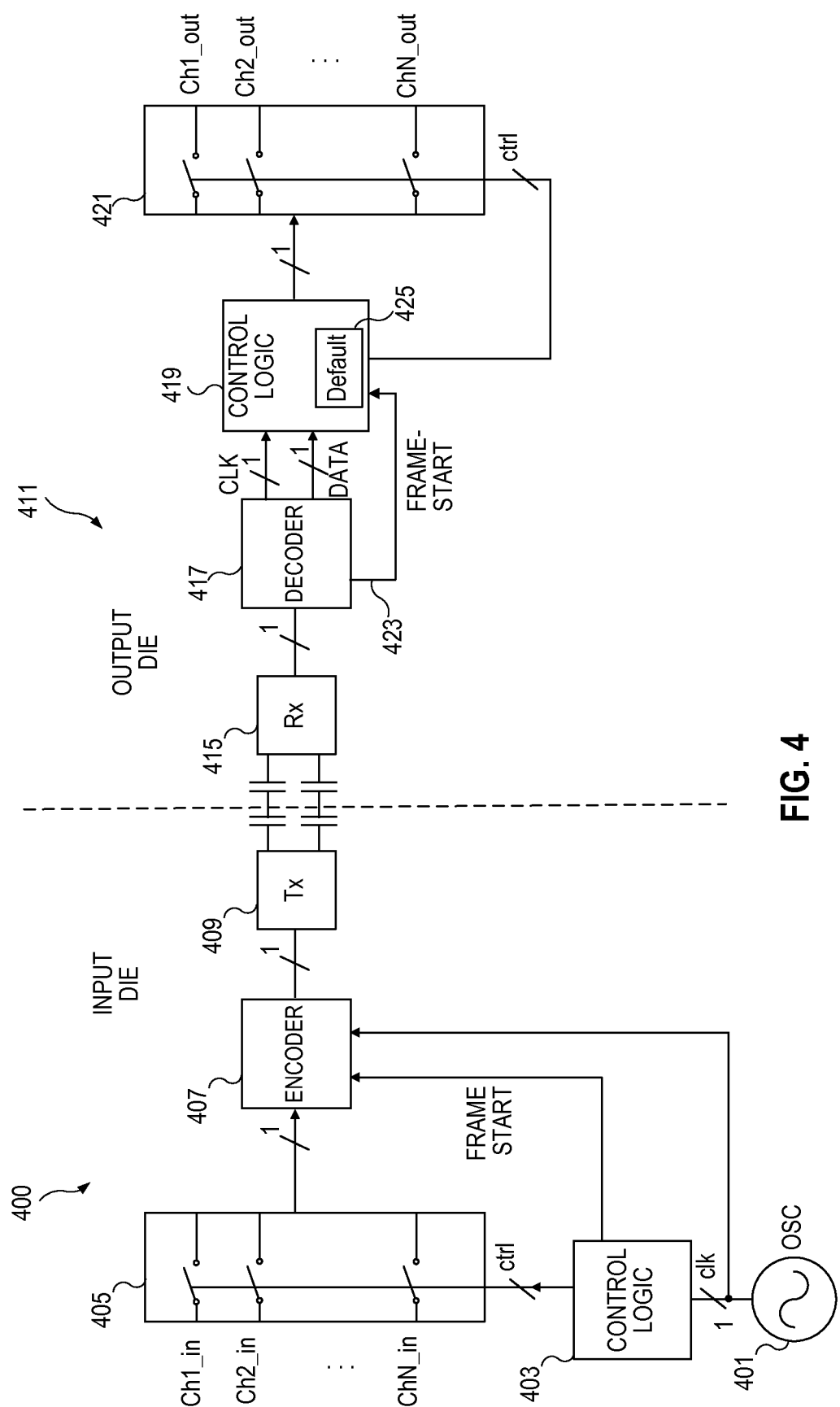
FIG. 4 illustrates additional details of an isolation system according to an embodiment.

FIG. 4 illustrates additional details of the embodiment of FIG. 3. The input die 400 includes an internal clock shown as oscillator 401 that supplies control logic 403 with a clock signal. The control logic 403, which may be implemented, at least in part as a state machine, controls the switch array 405. The control logic causes each input to be sampled periodically and supplied as data to the encoder 407. The control logic determines when to sample the N input channels and when to begin the start of a new frame. Note that although the switch array 405 is shown as directly coupled to the channel inputs, typically input latches are disposed between encoder 407 and the channel inputs. The control logic may provide the most recently sampled channel as the last bit of the frame since that channel bit is the last received data bit in the frame and therefore has the most delay before being output on the output die. The oscillator 401 also supplies encoder 407 with a clock signal. The encoder encodes the data, in an embodiment with a header having a pattern 0001 and two bits for each channel data encoded using Manchester encoding. The encoded data is supplied to transmitter 409 and transmitted to the output die 411 using differential capacitors to implement the isolated communication link. While shown as separate functions in FIG. 4, the encoder and control logic may be implemented as a single function. Other embodiments may use other types of isolation circuitry, e.g., a transformer. In the illustrated embodiment, the capacitors providing isolation are formed on the input and output dies respectively.

The output die on the receive side includes a receiver 415, a decoder 417 that detects the transition in the header, and decodes each of the encoded bits. The encoding may be as simple as a single bit in the transmitted data to represent the value of the input channel. In other embodiments, more complex encoding schemes may be utilized. In an embodiment, a header and Manchester encoding is utilized. When the header is detected, indicating a frame start, that signal is supplied to the output die control logic 419, which provides the control signals for the output switch array 421 so that the appropriate channel output may be updated when the bit becomes available from the decoder 417. The output latches are not illustrated for ease of illustration. The decoder 417 is assumed to include appropriate clock recovery circuitry and supply a recovered clock and data to the control logic. The decoder 417 is also shown to provide a frame start signal 423 to the control logic. While shown as separate functions in FIG. 4, the decoder and control logic may be implemented as a single function.

Figure 5:
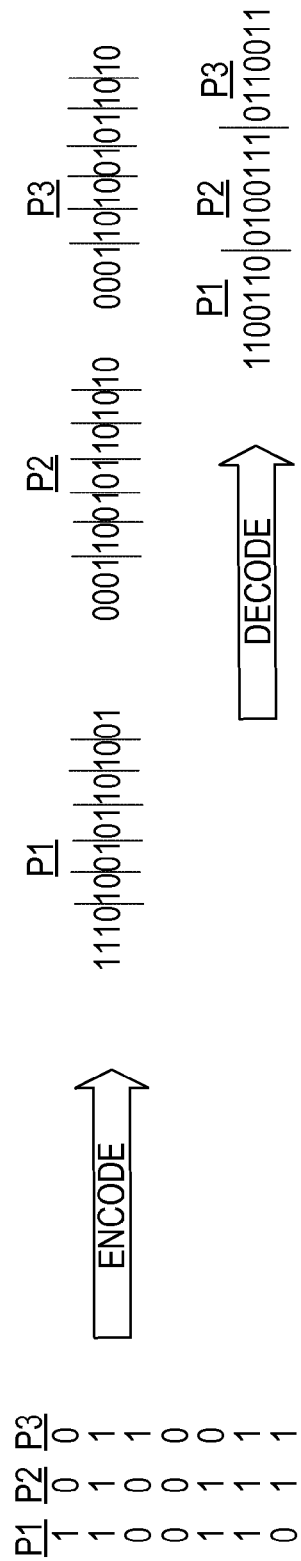
FIG. 5 illustrates encoding/decoding multiple channels according to an embodiment.

Note that while the header pattern in one embodiment is 0001, providing a 0 to 1 transition, a pattern of 1110 provides the same advantage of a pattern to indicate a header (three 1s) and a transition 1 to 0 that can be used by the decoder to synchronize to the transitions in the packet. Since either pattern can be used, in one embodiment the header is chosen according to the value of a bit in the frame, e.g., the first bit in the frame. For example, if the first bit in the frame is "1", the header is encoded as 1110. If the first bit in the frame is "0", the header is encoded as 0001. That allows the header to provide not only a transition, but also encode the first bit of data. Referring to FIG. 5, that approach allows 16 bits to encode 7 channels. FIG. 5 shows seven input channels being sampled to form packets P1, P2, and P3. The header is used to indicate the start of the frame and to encode the first data bit. The packets use Manchester encoding. The decoder receives and decodes the serially transmitted bits.

While Manchester encoding may be used in certain embodiments, various other encoding approaches may be utilized with embodiments described herein. The particular encoding technique may vary but error detection may be utilized in any particular encoding scheme. The error detection may be in part based on the type of encoding used. For example, if successive samples of a Manchester coded signal show no transitions, the control logic may determine an error has occurred. The error may be due to intermittent transmission errors or if the errors are continuous may indicate a loss of lock in the clock recovery circuit resulting in incorrect sampling of the received frame. Alternatively, the errors may be due to a power failure on the input die. The only way the output die knows of such a failure would be by recognizing that bad data was decoded. When an error is detected, the control logic may decide to not update the particular channel for which bad data was detected. For example, if a single bad channel bit is detected in a frame and the rest of the bits in the frame decode successfully, that one data bit for the one channel may not be updated, while the remaining bits are updated. Errors may also be detected based on error protection schemes built into the transmitted frames. For example, one or more frames may be protected by parity bits either across the channel or across the frame. For example, every 8 bits for channel 1 may be followed by a parity bit. On the other hand, each frame itself may have parity protection so it can be recognized if any errors occurred in the frame. Alternatively, a series of frames may be followed by a frame with cyclic redundancy check (CRC) information.

If the errors in the isolation channel reach a threshold level, as determined by the requirements of the particular application, then the outputs supplied by the control logic 419 may be frozen so that the output channels are no longer updated with known bad data. However, if the outputs supplied to the output channels are frozen, it is possible that the frozen values are invalid. Thus, an embodiment includes default values for the various output channels that may be stored in volatile or non-volatile storage 425 (see FIG. 4), e.g., as part of the control logic. When the threshold is reached for errors in the frame(s), e.g., due to a power failure on the input die, loss of lock by the output die, or another reason, the default values are supplied to the output channels. The control logic continues to supply the default values until the output die control logic has received valid data, meaning that the output die is once again locked and synchronized to receive valid data. The default values that are chosen are dependent on the type of signal being sent but are chosen to ensure that the impact on the receiving circuitry is appropriate.

Figure 6:
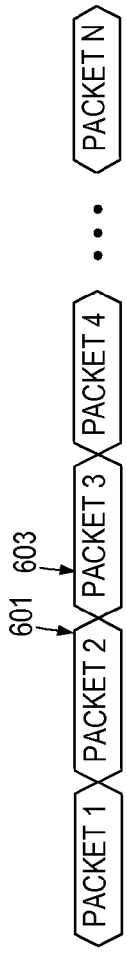
FIG. 6 illustrates continuous packet transmission according to an embodiment.

FIG. 6 shows the continuous transmission approach with frames being continuously sent from the primary die to the secondary die. Depending on the positioning of an input relative to the start of a frame, a small change in the timing of the input can result in the change in bit value being reflected in the current frame or the next frame, resulting in jitter equal to +/−(frame width/2), and worst case delay being approximately a frame width plus intrinsic delay. For example, assume a bit on CH3 changes value at 601 immediately before the channel 3 data of the packet is encoded by packet encoder 309. That bit is transmitted almost immediately upon receipt by the primary die 301 and is output by the secondary die 303 as soon as it is decoded and available for output. That results in a minimum delay of approximately the intrinsic delay. The intrinsic delay includes the channel delay and circuit delay associated with the circuitry on the input and output dies such as input and output latches and the control logic. The circuit delay could be substantial with respect to the overall intrinsic delay. On the other hand, assume the input on CH3 transitions at 603 immediately after the packet encoder completes encoding the channel 3 data. In that case, the transition is not reflected in the packet about to be transmitted (PACKET 3) and the updated value of channel 3 is not received until the next packet (PACKET 4), thus resulting in the worst case delay of approximately a frame width plus intrinsic channel delay. Since pulse width distortion (PWD) is determined by the jitter on rising and falling edges of the data (which are independent of and asynchronous with respect to the internal clock/frame start), the worst case PWD approximately equals +/− frame width.

Figure 7:
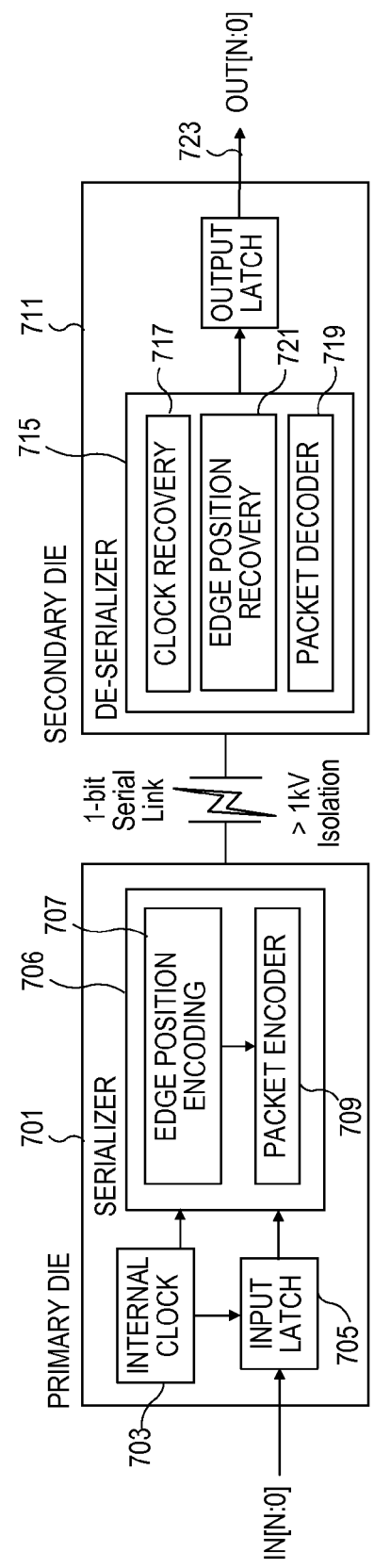
FIG. 7 illustrates a high level diagram of edge positioning encoding/decoding according to an embodiment.

One approach to address PWD utilizes continuous packet transmission with edge position recovery. Edge position recovery builds on the continuous packet transmission described in relation to, e.g., FIGS. 3 and 4 by adding a more sophisticated packet construction methodology. The frames are still transmitted continuously and asynchronously with respect to the input. However, instead of simply encoding data in the packet, the encoding scheme also encodes information about the amount of time elapsed since the input transitioned. FIG. 7 illustrates a high level diagram of an embodiment that provides edge position recovery. Edge position recovery requires extra bits, with the accuracy of the elapsed time information being determined by the number of bits allocated. Additional bits provide greater resolution but reduce information bandwidth. Since the maximum delay between a transition on the input and the corresponding data being transmitted is approximately one frame, the discretization is based on frame size. Based on the elapsed time information, the output signals can be appropriately delayed to reduce jitter. Delaying the output signals to reduce jitter results in latency on the order of a packet width (as this is the worst case delay in a signal getting transmitted). The goal is to delay the signals appropriately such that all the signals have a latency of approximately one frame width (or as close to it as possible given the quantization error of the edge position recovery scheme).

For example, in an embodiment four bits are allocated for edge position recovery information. In an embodiment, the value '1111' for the recovery information indicates that nearly an entire packet has elapsed since the input transitioned, and thus when the data is recovered on the secondary die, the data should go to the output immediately. The value '0000' for the recovery information indicates that the transition happened right before the packet was ready to transmit. Therefore the output should be delayed (after the data and associated recovery information is decoded) by approximately a whole frame width to reduce jitter.

FIG. 7 shows an exemplary embodiment of an isolation system with edge position recovery information. The primary die 701 includes an internal clock 703 and an input latch 705. The serializer logic 706 includes edge position encoding circuit 707 determines recovery information as described further herein and supplies the recovery information to the packet encoder 709. The secondary die 711 includes deserializer logic 715 that includes clock recovery logic 717 that recovers a clock, e.g., based on transitions in the frame. The packet decoder and edge position recovery logic 721 recreate the data on the input channels and supplies the data to output 723 based on the edge position recovery data.

Figure 8:
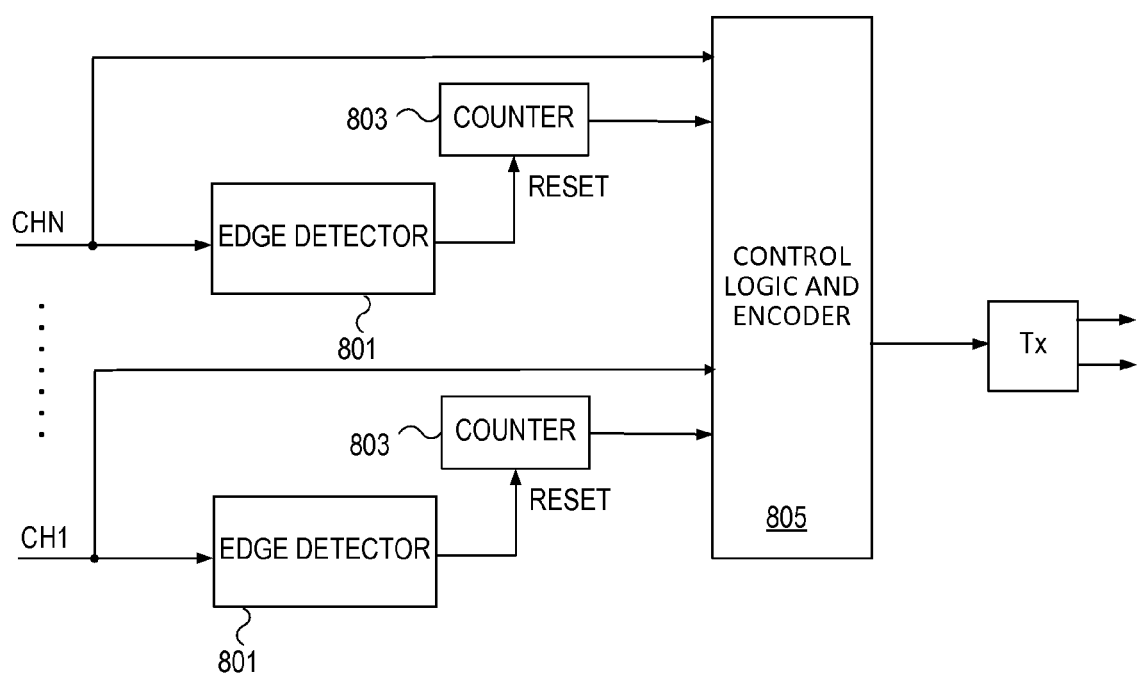
FIG. 8 illustrates additional details of edge positioning according to an embodiment.

Referring to FIG. 8, a high level block diagram illustrates an embodiment that determines edge position recovery information utilizing edge detection and counters. Remember the channels transition independently and asynchronously with respect to the clock signal on the primary die. In the embodiment of FIG. 8, edge detectors 801 are provided for each channel. The edge detect circuit 801 may be conventional and is not further described herein. Each edge detector asserts a reset signal to its corresponding continuously running counter 803 whenever an edge is detected. The counter values are supplied to the control logic and encoder 805 for inclusion in the frame as the edge position recovery information providing an indication of how long a transition has occurred before frame start for each bit. The logic in FIG. 8 operates as follows. To construct a frame with edge position recovery information, if the channel data value has changed, the control logic and encoder encodes the new channel value and the counter value into the frame for that channel. If the channel data has not changed, the unchanged channel data is encoded into the frame and don't care information (e.g., all 0s) is encoded into the frame for the edge position recovery information. Determining whether the channel data has changed can be implemented by the control logic by comparing the value of the last transmitted bit to the current value of the bit.

Figure 9:
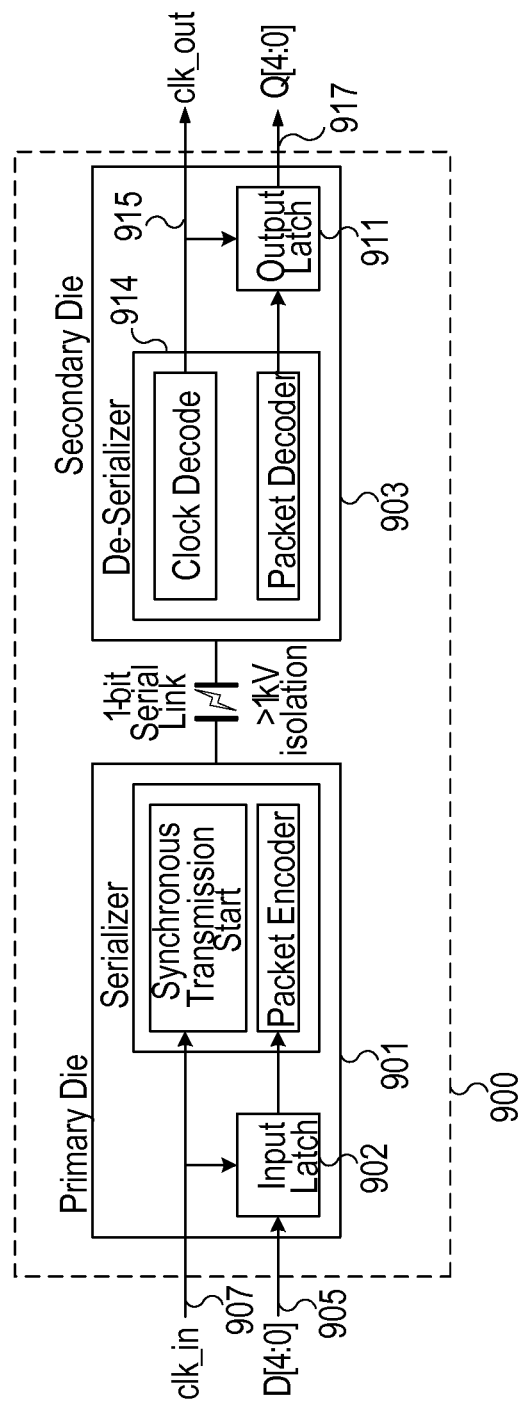
FIG. 9 illustrates a high level block diagram of a synchronous isolation channel.

While embodiments herein have utilized continued packet transmission, other embodiments may utilize synchronous transmissions. Such an embodiment is illustrated in FIG. 9. The embodiment of FIG. 9 provides a low latency/jitter way of transmitting multiple signals from input die 901 to output die 903 that reside in package 900 in which the two die are disposed. Whenever a transition is seen on clk_in 907 (rising edge, falling edge, or both), the values for input data 905 are latched into the input latches 902 using clk_in 907 and the serializer transmits a packet that contains information on the state of inputs D<4:0> across the isolation channel. The input clock signal clk_in may be sufficiently slow to allow the packet to be transmitted across the isolation channel between clock edges (or selected input clock edges are skipped). The secondary die detects this packet in deserializer 914, and recovers the clock and data from the transmitted packet using techniques that depend on the encoding scheme used for the packet. Once the clock and data is recovered, the data is supplied synchronously with the output clock clk_out 915 from output latch 911 to the output channels 917. In that way the output data is always synchronous with the input clock signal clk_in, reducing jitter and pulse width distortion significantly.

Figure 10:
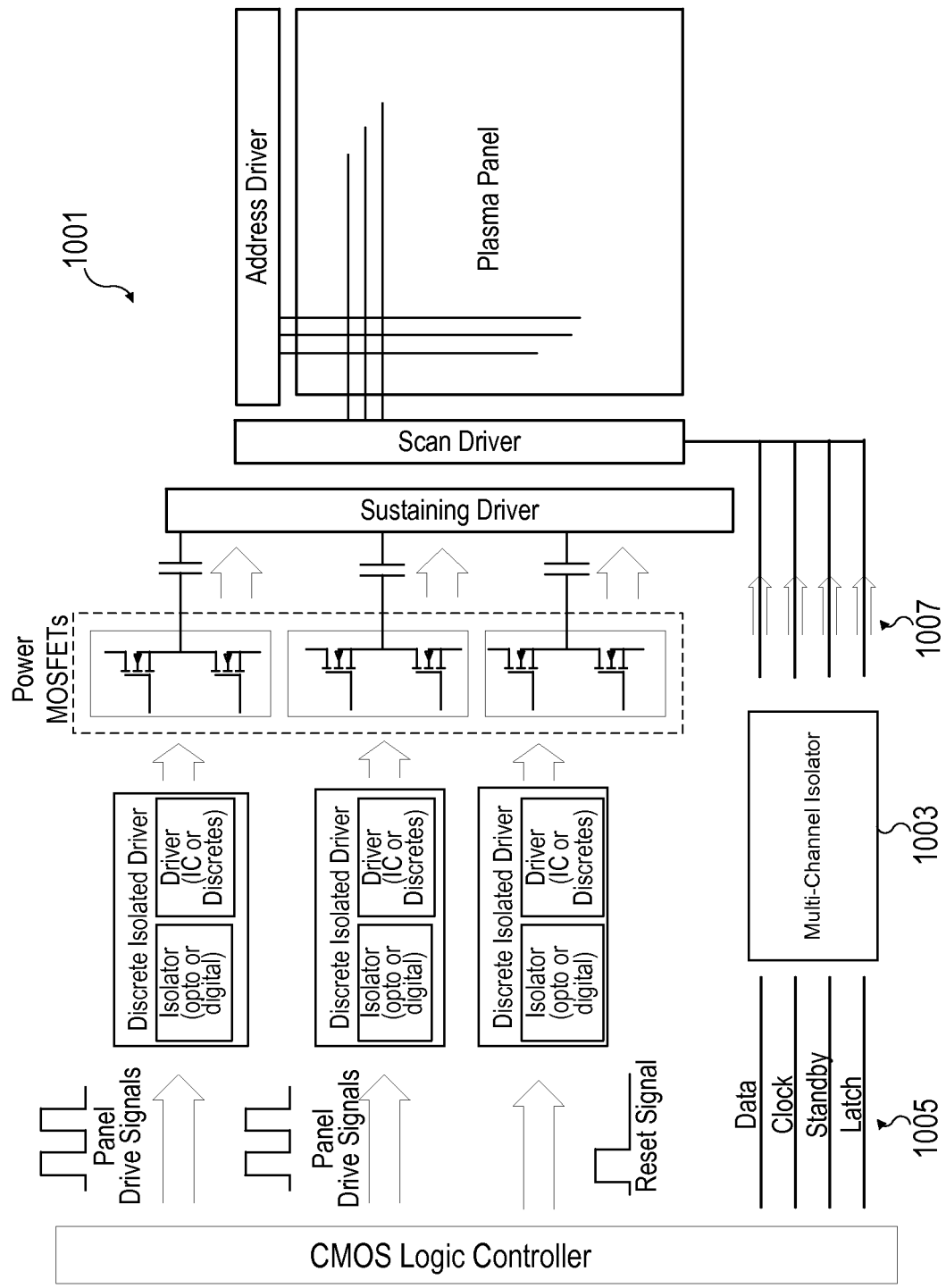
FIG. 10 illustrates an embodiment in which a television system incorporates a multi-channel isolator providing communication between multiple input channels and multiple output channels using a single isolation communication channel.

FIG. 10 illustrates an embodiment in which a plasma television system 1001 utilizes a multi-channel isolator 1003 that receives multiple input channels 1005 and supplies multiple output channels 1007 that are used by the scan driver of the plasma panel. The multi-channel isolator may be implemented in accordance with the embodiments shown, e.g., in FIG. 3 or 9 using continuous channel transmission or synchronous channel transmission.

Thus, aspects of an isolation system that carries information from multiple input channels to multiple output channels has been described. The description set forth herein is illustrative, and is not intended to limit the scope of the invention as set forth in the following claims. For example, while embodiments have been described using capacitive isolation, one of skill in the art will appreciate that the teachings herein can be utilized in other isolation approaches. Further, aspects described herein such as header transitions, may be applicable to systems other than isolation systems. Variations and modifications of the embodiments disclosed herein may be made based on the description set forth herein, without departing from the scope and spirit of the invention as set forth in the following claims.

What is claimed is:
1. A method comprising:
receiving input data from a plurality of input channels at a first integrated circuit die;
combining the input data from the plurality of input channels into combined data;
transmitting the combined data from the plurality of input channels serially across an isolation communication channel;
decoding the transmitted combined data at a second integrated circuit die coupled to the isolation communication channel; and
supplying the decoded transmitted combined data to respective output channels corresponding to the input channels.
2. The method as recited in claim 1 further comprising:
detecting an error condition associated with the isolation communication channel; and
supplying respective default data to the respective output channels responsive to detecting the error condition.
3. The method as recited in claim 2 wherein the error condition is associated with an error in the transmitted data.
4. The method as recited in claim 1 further wherein the decoding further comprises:
decoding edge position recovery information associated with data in the transmitted combined data corresponding to one of the input channels, the edge position recovery information indicating an amount of time elapsed since the data in the transmitted combined data corresponding to the one of the input channels transitioned; and updating one of the output channels corresponding to the one of the input channels with the data in the transmitted combined data associated with the edge position recovery information with a delay determined according to the edge position recovery information.

5. The method as recited in claim 4 further comprising generating the edge position recovery information using a counter that resets responsive to transitions on the one of the input channels.

6. The method as recited in claim 1 further comprising continuously transmitting the combined data over the communication channel.

7. The method as recited in claim 1 further comprising transmitting the combined data in synchronism with a clock signal received by the first integrated circuit die.

8. The method as recited in claim 1 further comprising:
combining the input data into a frame to form the combined data, the frame including a header portion and plurality of data bits corresponding to respective ones of the plurality of input channels, wherein the header portion includes a first portion having at least three sequential bits of a first value and a second portion sequential to the first portion having a bit of a second value providing a transition in the header portion of the frame.

9. The method as recited in claim 8 wherein the first portion and the second portion comprise a first sequence of bits to represent a first value of a data bit of the frame and a second sequence of bits to represent a second value of the data bit.

10. An apparatus comprising:
a first integrated circuit die including,
an interface to receive information from a plurality of channels;
an encoder circuit to combine the information from the plurality of input channels into a combined channel data;
an isolation communication channel to receive the combined channel data;
a second integrated circuit die coupled to the isolation communication channel and including,
a decoder circuit to decode the combined channel data transmitted over the isolation channel; and
an output circuit to supply the decoded combined channel data to respective output channels corresponding to the plurality of input channels.

11. The apparatus as recited in claim 10 wherein the isolation communication channel comprises at least one capacitor.

12. The apparatus as recited in claim 10 wherein the isolation communication channel comprises a transformer.

13. The apparatus as recited in claim 10 further comprising:
control logic to detect an error condition associated with the isolation communication channel; and
wherein the control logic is configured to cause respective default data to be supplied to the respective output channels responsive to detecting the error condition.

14. The apparatus as recited in claim 10 wherein the combined channel data is formed into a frame including a header and plurality of data bits, wherein the header includes a first portion of at least three sequential bits of a first value and a second portion including a bit of a second value to provide a transition of adjacent bits between the first portion of the header and the second portion of the header.

15. The apparatus as recited in claim 14 wherein a first sequence of bits in the first and second portion represents a first value of one of the data bits in the frame and a second sequence of bits in the first and second portion represents a second value of the one of the data bits in the frame.

16. The apparatus as recited in claim 10 wherein the second integrated circuit die is further configured to:
decode edge position recovery information in the combined channel data indicating an amount of time elapsed since a data bit corresponding to one of the input channels in the combined channel data transitioned; and
output the data bit associated with the edge position recovery information with a delay determined according to the edge position recovery information to one of output channels corresponding to the one of the input channels.

17. The apparatus as recited in claim 10 wherein the first integrated circuit die further comprises:
an edge position encoding circuit to detect a transition of an input channel and generate edge position recovery information related to the transition.

18. The apparatus as recited in claim 10 wherein the first integrated circuit die is configured to continuously transmit frames over the communication channel.

19. The apparatus as recited in claim 10 wherein the first integrated circuit die is coupled to receive a clock input signal and is configured to transmit the combined channel data over the isolation communication channel in synchronism with the clock signal.

20. A packaged integrated circuit comprising:
an output integrated circuit die including,
a receiver circuit coupled to an isolation communication channel;
a decoder and control logic coupled to the receiver circuit to decode combined channel data received from the isolation communication channel and to supply data to respective output channels, wherein the decoder and control logic is further configured to detect an error condition associated with the combined channel data; and
wherein the decoder and control logic are configured to cause respective default data to be supplied to the respective output channels responsive to detecting the error condition and to supply decoded combined channel data to the respective output channels responsive to satisfactory decode of the combined channel data.

21. The packaged integrated circuit as recited in claim 20 further comprising
an input integrated circuit die including,
an interface to receive information from a plurality of channels;
an encoder circuit to combine information from the plurality of input channels into the combined channel data; and
a transmit circuit to transmit the combined channel data to the isolation communication channel.

22. The packaged integrated circuit as recited in claim 21 wherein the error condition is associated with a power loss on the input integrated circuit die.

23. An apparatus comprising:
a first integrated circuit including circuit configured to serialize data from a plurality of input channels into a frame for transmission across an isolation link, the frame including a header with a plurality of sequential bits with a first plurality of the sequential bits having a first value and a last bit of the sequential bits having a second value, to provide a transition in the header between the last bit and a next to last bit in the header; and a second integrated circuit coupled to the first integrated circuit to receive the frame, and the second integrated circuit including a decoder circuit to decode the frame using the transition in the header as a synchronization point to decode data bits in the frame.

24. The apparatus as recited in claim 23 wherein the first plurality of the sequential bits are encoded to have the first value and the last bit is at the second value to indicate a first value of one of the data bits in the frame and the first plurality of the sequential bits are at a second value and the last bit is at the first value when the one of the data bits in the frame is at the second value.

25. The apparatus as recited in claim 23 wherein the second integrated circuit is configured to supply respective decoded data bits in the frame to a plurality of output channels corresponding to the input channels.

\* \* \* \* \*

UNITED STATES PATENT AND TRADEMARK OFFICE
CERTIFICATE OF CORRECTION

PATENT NO.        : 9,118,392 B2                                    Page 1 of 1
APPLICATION NO.   : 14/041459
DATED             : August 25, 2015
INVENTOR(S)       : Sundar et al.

It is certified that error appears in the above-identified patent and that said Letters Patent is hereby corrected as shown below:

In the claims
Column 8, line 1, claim 4 delete "further".

Signed and Sealed this
Twelfth Day of January, 2016

Michelle K. Lee
*Director of the United States Patent and Trademark Office*